(12) United States Patent
Sato et al.

(10) Patent No.: US 7,551,281 B2
(45) Date of Patent: Jun. 23, 2009

(54) POSITION SENSOR

(75) Inventors: Hiroshi Sato, Tochigi (JP); Kazuhiko Mishima, Tochigi (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/203,249

(22) Filed: Sep. 3, 2008

(65) Prior Publication Data

US 2009/0040489 A1 Feb. 12, 2009

Related U.S. Application Data

(60) Continuation of application No. 11/871,610, filed on Oct. 12, 2007, now Pat. No. 7,450,249, which is a division of application No. 10/771,992, filed on Feb. 3, 2004, now Pat. No. 7,298,500.

(30) Foreign Application Priority Data

Feb. 3, 2003 (JP) ............................. 2003-026541

(51) Int. Cl.
 *G01J 4/00* (2006.01)
(52) U.S. Cl. ..................... 356/364; 356/369; 356/614
(58) Field of Classification Search .............. 356/364, 356/369, 614, 620; 250/559.09, 559.29, 250/225
See application file for complete search history.

(56) References Cited

U.S. PATENT DOCUMENTS

| | | | |
|---|---|---|---|
| 6,452,661 B1 * | 9/2002 | Komatsuda | .................... 355/67 |
| 6,507,388 B2 | 1/2003 | Burghoorn | |
| 6,727,980 B2 * | 4/2004 | Ota et al. | ....................... 355/55 |
| 6,765,201 B2 * | 7/2004 | Uto et al. | ......................... 850/8 |
| 6,765,649 B2 * | 7/2004 | Orino | ............................. 355/67 |
| 6,765,673 B1 * | 7/2004 | Higashikawa | ............... 356/399 |
| 6,962,825 B2 | 11/2005 | Murakami | |
| 6,992,780 B2 * | 1/2006 | Sentoku et al. | ............. 356/620 |
| 7,046,330 B2 | 5/2006 | Murakami | |
| 7,081,962 B2 | 7/2006 | Nakauchi | |
| 7,148,973 B2 * | 12/2006 | Sentoku et al. | ............. 356/620 |
| 7,173,716 B2 * | 2/2007 | Oishi et al. | .................. 356/620 |
| 2001/0055100 A1 | 12/2001 | Murakami | |
| 2002/0080338 A1 * | 6/2002 | Taniguchi | ..................... 355/67 |
| 2003/0095241 A1 | 5/2003 | Burghoorn | |
| 2006/0007416 A1 | 1/2006 | Murakami | |

FOREIGN PATENT DOCUMENTS

| | | |
|---|---|---|
| JP | 06-267820 | 9/1994 |
| JP | 10-268098 | 10/1998 |
| JP | 2001-284210 | 10/2001 |
| JP | 2002-164268 | 6/2002 |
| JP | 2003-022949 | 1/2003 |

* cited by examiner

*Primary Examiner*—Roy Punnoose
(74) *Attorney, Agent, or Firm*—Rossi, Kimms & McDowell LLP

(57) ABSTRACT

A position detecting apparatus for detecting position of an object disposed in a first space by receiving light from the object with a light receiving element disposed outside said first space, said position detecting apparatus includes an optical system for directing light from the object to the light receiving element, and a first optical element transmitting light from the object, disposed in a partitioning member for partitioning said first space and space outside said first space, wherein said first optical element is located on a position on or near a pupil plane or a plane conjugate to the pupil plane of said optical system.

5 Claims, 14 Drawing Sheets

| | A | | B | | C | | | |
|---|---|---|---|---|---|---|---|---|
| | DEFORM EACH SURFACE | | INCLINED DECENTER FOR EACH SURFACE (COLOR SHIFT ("CS")) | COLOR SHIFT PER SURFACE ("CSS") | INCLINED DECENTER (CENTER WAVELENGTH) | | | COLOR SHIFT |
| | $Sk_A$ | $\beta_A$ | $dy_B CS$ | $dy_B CSS$ | $dy_C$ | $wah_C$ | $wac_C$ | $dy_C CS$ |
| a | -2.60 | 1.15 | -1.23 | 5.11 | 0.05 | -6.50 | -0.66 | 0.15 |
| b | 255.40 | -1.69 | 0.47 | 0.37 | -30.73 | 95.34 | 1.00 | 0.06 |
| c | 1.60 | -1.15 | 0.09 | 0.04 | -30.77 | 88.83 | -0.85 | 0.09 |
| d | 1.00 | 1.00 | 1.00 | 1.00 | 1.00 | 1.00 | 0 | 1.00 |
| e | 0.90 | 0.85 | 0.99 | 2.88 | 0.99 | 1.00 | 0 | 1.00 |
| f | 0.80 | 0.77 | 0.98 | -4.63 | 1.00 | 1.00 | 0 | 1.00 |
| g | 1.40 | -1.08 | 0.09 | 5.30 | -4.70 | 0.17 | 0 | 0.10 |
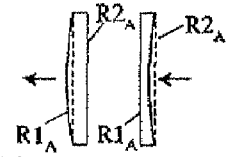
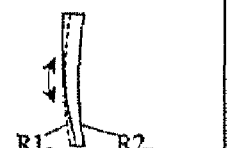
FIG. 7

POSITION SENSOR

This is a continuation application of prior application Ser. No. 11/871,610 filed on Oct. 12, 2007, which is a divisional of application Ser. No. 10/771,992 filed on Feb. 3, 2004 (now U.S. Pat. No. 7,298,500).

This application claims a benefit of foreign priority based on Japanese Patent Application No. 2003-026541, filed on Feb. 3, 2003, which is hereby incorporated by reference herein in its entirety as if fully set forth herein.

BACKGROUND OF THE INVENTION

The present invention relates generally to a position sensor, and more particularly to a position sensor provided in an exposure apparatus that transfers a fine circuit pattern. The present invention is suitable, for example, for an exposure apparatus that uses ultraviolet light ("UV") and extreme ultraviolet ("EUV") light as an exposure light source and purges an exposure optical path.

A reduction projection exposure apparatus has been conventionally employed which uses a projection optical system to project a circuit pattern formed on a mask or a reticle onto a wafer, etc. to transfer the circuit pattern, in manufacturing such a fine semiconductor device as a semiconductor memory and a logic circuit in photolithography technology.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm). However, the lithography using the ultraviolet light has the limit to satisfy the rapidly promoting fine processing of a semiconductor device, and a reduction projection optical system using EUV light with a wavelength of 10 to 15 nm shorter than that of the ultraviolet (referred to as an "EUV exposure apparatus" hereinafter) has been developed to efficiently transfer a very fine circuit pattern.

The projection optical system is also required to improve throughput as the number of sheets exposed per unit of time. The improved throughput needs the shorter exposure time for each object to be exposed, and the increased exposure light intensity or light quantity or dose to be irradiated onto the object per unit of time. However, the light with a short wavelength is easily subject to absorptions in a material, and its light intensity remarkably decreases when the light transmits in the air or oxygen. Accordingly, the reduction projection optical system that uses light with a short wavelength as exposure light, such as $F_2$ laser and EUV light, closes the space for the optical path area through which the exposure light transmits, and purges the closed space with highly-purity gas (e.g., high-purity purge gas of helium and nitrogen) which is free of impurities, such as organic materials and oxygen, or vacuums up the optical path area through which the exposure light transmits so as to maintain the dose that reaches the wafer.

In particular, the EUV light remarkably decreases its light quantity after passing through a lens, and its light quantity becomes almost zero on a wafer when the EUV light is irradiated on the wafer through an optical system that uses a lens as used for visual light and UV light. The EUV exposure apparatus thus maintains light quantity on the wafer, by closing the space around the exposure light's optical path, by highly vacuuming the space, and by providing an optical system with only mirrors.

The conventional exposure apparatus forms a closed space with a diaphragm between a purged space that purges with purge gas or vacuums the space around a light source, an illumination optical system, a reticle, a projection optical system, and a stage, and an exposure light's optical path, and an external space outside the purged space. The exposure apparatus needs various sensing optical systems, such as an off-axis alignment ("OA") optical system, a reticle alignment optical system, a focus detecting system, and a wafer position-sensing interferometer.

An OA optical system for detecting an alignment mark on the wafer and thereby a wafer position preferably locates an objective lens closer to the exposure area for a shorter interval or baseline amount between the exposure position and a measurement position of the OA optical system. This is because a wafer is moved to the exposure position by the baseline amount after the OA optical system finishes the alignment, and the alignment accuracy needs a stable and small baseline amount for reduced errors. This means that part of the OA optical system should be located in the purged space.

The reticle alignment optical system for detecting a reticle's position should arrange its part in the purged space since the reticle is located on the exposure light's optical path. In addition, the focus detection system and wafer position-sensing interferometer etc. should arrange their parts in the purged space because their objects to be detected are located in the purged space.

Therefore, these sensing optical systems arranged across the purged space and the external space maintain the closed space and its arrangement with a transmission window member as a diaphragm on the optical path that partitions the purged and external spaces.

The purged space has a pressure different from the external space due to a supply of purge gas or a vacuum atmosphere. A difference between two spaces is particularly very large when the purge space is vacuumed. Thus, a transmission window member as a diaphragm that partitions two spaces receives a large force, and often deforms and/or decenters. These deformation and decentering of the transmission window member on the optical path in the detection system have not been expected in the design, and result in magnification variance, color shift and aberration, such as distortion, deteriorating detection accuracy.

Referring now to FIG. 14, a description will be given of a deformation of the transmission window member caused by a pressure difference. FIG. 14 is a schematic sectional view of the transmission window member deformed by the pressure difference. FIG. 14A shows a transmission window member 1000 at a diaphragm 1100 that partitions a purged space PE and an external space OE. Initially, the transmission window member 1000 does not receive any force or deform.

When the purged space PE is, for example, vacuumed, the pressure in the purged space PE decreases and the transmission window member 1000 receives a force $P_1$ toward the purged space PE, as shown in FIG. 14B, deforming like a meniscus lens. On the other hand, when high-purity purge gas is supplied to the purged area PE to increase its pressure, a force reverse to the force $P_1$ applies to the transmission window member 1000.

Since the transmission window member 1000 perpendicularly receives the force $P_1$, the generated birefringence directs perpendicular to the polarized direction of the incident light and seldom affects the optical performance. However, the diaphragm 1100 that holds the transmission window member 1000 generates a force $P_2$ in response to the force $P_1$ applied to the transmission window member 1000, which force $P_2$ generates birefringence parallel to the polarized direction of the incident light and affects the polarization of the incident light.

When the purged space PE is vacuumed, extremely large force applies to the diaphragm 1100 and the transmission window member 1000, and the diaphragm 1100 conceivably deforms and distorts, as shown in FIG. 14C. FIG. 14C schematically shows the deformed diaphragm 1100 by an angle θ in the purged space PE. Then, the transmission window member 1000 deforms with the diaphragm 1100 by an angle θ due to the deformation under a pressure difference. In other words, the decentering element includes not only the angle θ relative to the optical axis (which is referred to as an "inclined decenter" hereinafter), but also a shift Δd in a direction perpendicular to the optical axis associated with the inclined decenter (which is referred to as a "parallel decenter" hereinafter).

These deformations of the transmission window member possibly result from manufacture errors and changes with time. Regular adjustments need to correct changes with time, and otherwise the measurement accuracy would greatly deteriorate.

On the other hand, it is conceivable to arrange all the elements of the sensing optical system in the purged space instead of arranging part of them in the purged space and the rest in the external space. However, they include a heat source that thermally deforms a holding mechanism and other members, offsets a projection optical system, and deteriorates the measurement accuracy. Therefore, it is not possible to arrange all the elements of the sensing optical system in the purged space.

BRIEF SUMMARY OF THE INVENTION

Accordingly, it is an exemplary object of the present invention to provide a highly accurate position sensor that maintains the optical performance of its optical system that arranges on an optical path an element as a diaphragm between two spaces having different pressures, even when the element deforms.

A position sensor of one aspect according to the present invention for detecting position of an object disposed in a first space (i.e., the purged space PE) by receiving light from the object with a light receiving element disposed outside the first space (i.e., the external space OE), the position detecting apparatus includes an optical system for directing light from the object to the light receiving element, and a first optical element transmitting light from the object, disposed in the partitioning member for partitioning the first space and space outside the first space, wherein the first optical element is located on a position on or near a pupil plane (a Fourier transform plane with respect to optical system) or a plane conjugate to the pupil plane of the optical system.

The first optical element may be located on or near a pupil plane or a plane conjugate to the pupil plane which has a smallest effective diameter of light ray. The position near a pupil plane may be position between pupil plane and an at least one of closest optical element to the pupil plane on the image side and closest optical element to the pupil plane on the object side of the optical system.

The position near a plane conjugate to the pupil plane may be position between a plane conjugate to the pupil plane and an at least one of closest optical element to the plane conjugate to the pupil plane on the image side and closest optical element to the plane conjugate to the pupil plane on the object side of the optical system. The pressure of the first space and outside first space may be different. The first optical element may be the closest optical element to the light receiving element.

A position detecting apparatus of another aspect according to the present invention that uses light to detect a position of an object, the position detecting apparatus includes an optical element disposed on a partitioning member for partitioning two spaces having different pressures, and a correction member for correcting an optical change caused by a deformation of the optical element. The optical element may be a lens.

The correction member may be at least one of a parallel plate and a wedge optical member. A position detecting apparatus may further include a detector, located on an image surface of the object, for receiving the light from the object, wherein the correction member drives the detector, and corrects a positional offset on a plane perpendicular to an optical axis on an image surface of the object.

The correction member may be located at a position that generates sensitivity similar to the optical change, and the correction member corrects at least one of coma and spherical aberration. The optical change may include a magnification, and the correction member may include a processor for correcting the magnification through processing. A position detecting apparatus may further include a detector, located on an image surface of the object, for receiving the light from the object, wherein the correction member drives at least one of the detector and the object, and corrects a shift of a focus position.

A position detecting apparatus of another aspect according to the present invention located across a first space and a second space that has a different pressure from that of the first space, the position sensor using light to detect a position of an object that is located in the first space, the position sensor includes a detector, located in the second space (i.e., the external space OE), for receiving the light from the object, a polarizer that defines a polarization direction of the light, and an optical element that transmits the light, partitions the first and second spaces, and is closer to the detector than the polarizer. One of the first and second spaces may be maintained vacuum or in a reduced pressure.

An exposure apparatus of another aspect according to the present invention for exposing an object, the exposure apparatus comprising a position detecting apparatus used for an alignment or focusing of the object, the position detecting apparatus disposed in a first space by receiving light from the object with a light receiving element disposed outside the first space, the position detecting apparatus includes an optical system for directing light from the object to the light receiving element, and a first optical element transmitting light from the object, disposed in the partitioning member for partitioning the first space and space outside the first space, wherein the first optical element is located on a position on or near a pupil plane or a plane conjugate to the pupil plane of the optical system.

A device fabrication method of another aspect of the present invention includes the step of exposing an object using an exposure apparatus, and performing a development process for the object exposed. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 7 is a table showing results of deformed optical element at different positions in the sensing optical system shown in FIG. 6.

DETAILED DESCRIPTION OF THE PREFERRED EMBODIMENTS

Figure 1:
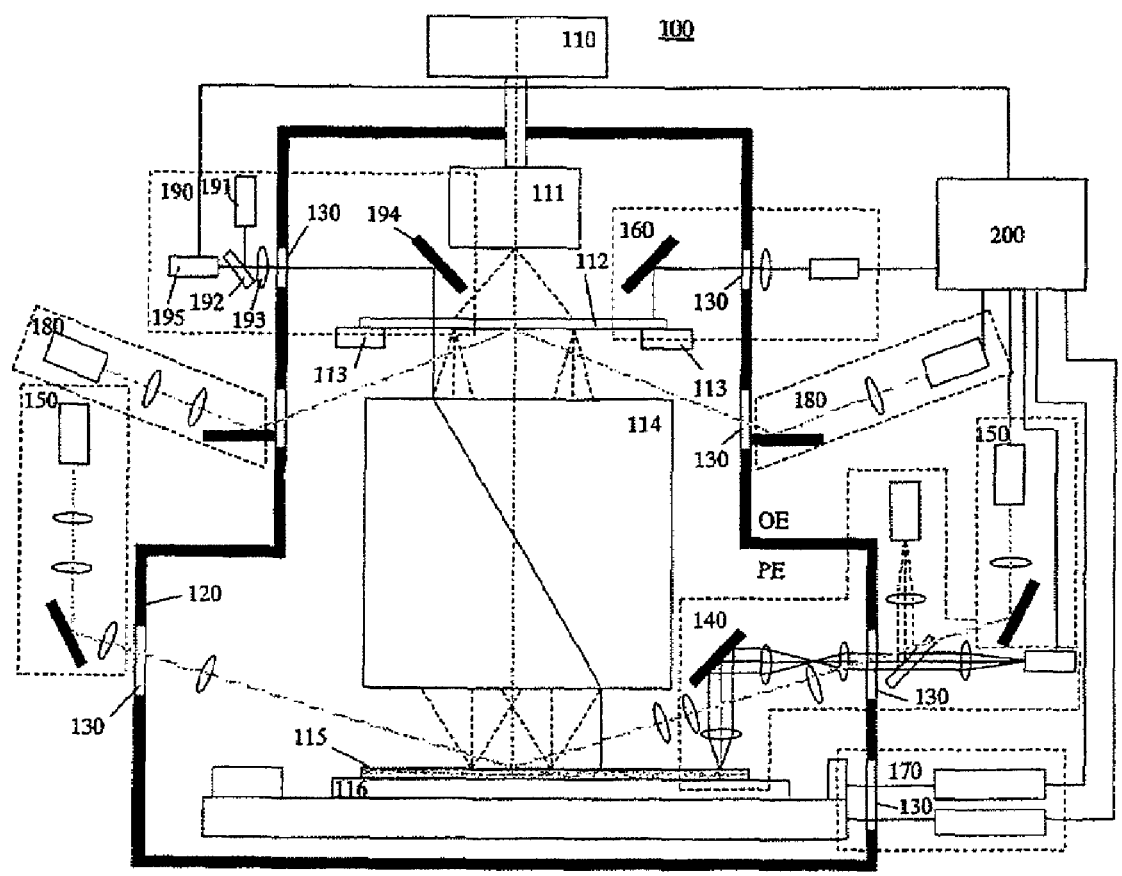
FIG. 1 is a schematic view of an exposure apparatus of one aspect according to the present invention.

With reference to accompanying drawings, a description will now be given of the present invention. The same element in each figure is designated by the same reference numeral, and a duplicate description thereof will be omitted.

Figure 14A:
FIGS. 14(a), 14(b) and 14(c) are schematic sectional view showing deformations of a transmission window member which result from pressure differences.
Figure 14B:
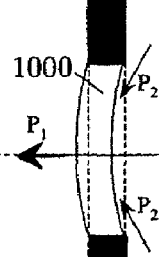
Figure 14C:
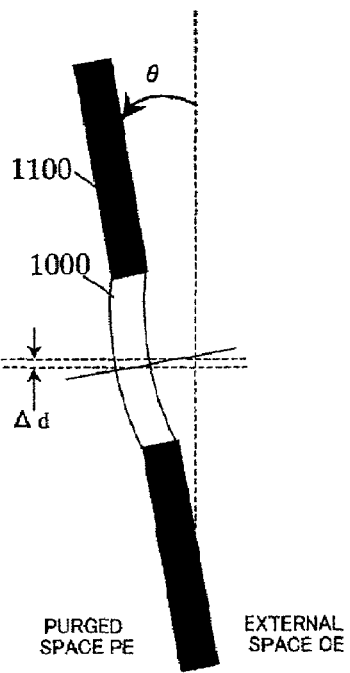

In providing a position sensor that provides a highly accurate position sensor that maintains the optical performance of its optical system that arranges on an optical path an element as a diaphragm between two spaces having different pressures, even when the element deforms, the instant inventors have earnestly studied optical performance of an imaging optical system changed by a deforming optical element as a parallel plate, by providing a specific curvature to the optical element as a substitute for the deformed transmission window member 1000 shown in FIG. 14, by arranging this optical element on an optical path in a sensing optical system, and by considering parallel and inclined decenters of the optical element that has a curvature deformation on its front and back surfaces.

Figure 6:
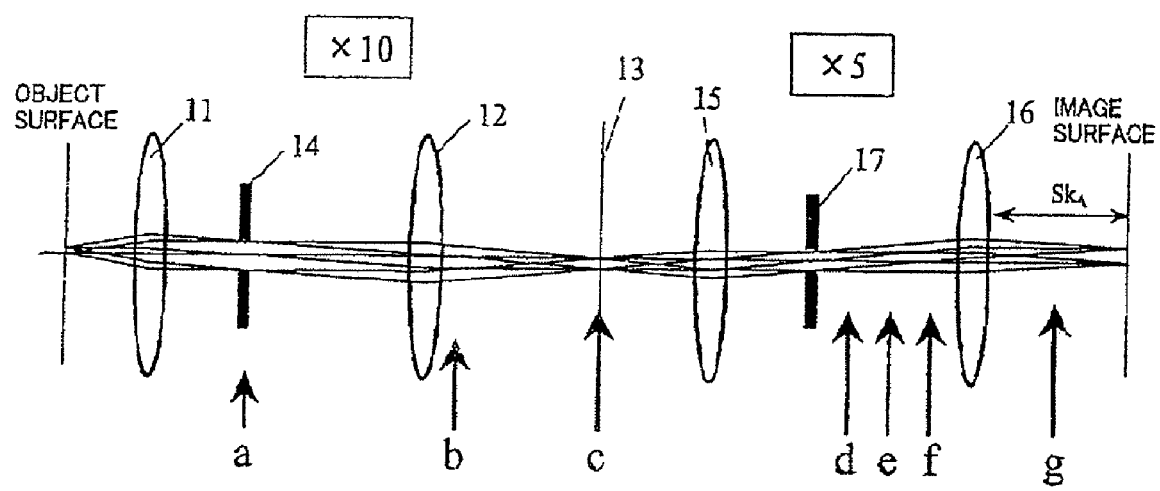
FIG. 6 is a schematic view of an arrangement of optical elements that have curvature deformations in a basic sensing optical system.

FIG. 6 is a schematic view of an arrangement of optical elements that have a curvature deformation in a basic sensing optical system 10. While this optical system is for illustrative purposes or not limited to both-side telecentric, it may be one-side, e.g., image-side or object-side telecentric.

The studied detection light covers wavelengths between 500 nm and 700 nm with a basic wavelength of 600 nm as a center, and different changes of the optical performance according to detection light's different wavelengths, which is referred to as a color shift hereinafter, are observed from results for both end wavelengths, i.e., 500 nm and 700 nm.

The sensing optical system 10 shown in FIG. 6 once images on-axis and off-axis rays emitted from an object surface through an objective lens 11 and a relay lens 12, and forms an intermediate image 13. 14 denotes a stop (or a pupil) arranged at a pupil position of the objective lens 11 and the relay lens 12. The light that has once imaged on the intermediate image surface 13 is re-imaged on an image surface through an imaging lens front group 15 and an imaging lens back group 16. 17 denotes a stop (or a pupil) arranged at a pupil position of the imaging lens front group 15 and back group 16. It is assumed that the objective lens 11 and the relay lens 12 have a lateral magnification of 10 times, the imaging system (including the imaging lens front group 15 and back group 16) has a lateral magnification of 5 times, and the detection system 10 entirely has a lateral magnification $\beta$ of 50 times. A diameter ratio between the pupils 14 and 17 is 6.2:1.0.

The instant embodiment arranges an optical element at seven points, provides the optical element with a curvature and decenter, and studies optical-performance changes of the imaging optical system. These seven points include a point "a" near the stop or pupil 14 (that has a Fourier-conversion relationship with the object surface) between the objective lens 11 and the relay lens 12, a point "b" near the relay lens 12 between the relay lens 12 and the intermediate image surface 13, a point "c" near the intermediate image surface 13, points "d", "e" and "f" between the stop or pupil 17 and the imaging lens back group 16, and a point "g" between the imaging lens back group 16 and the image surface.

FIG. 7 is a table showing results of the optical element deformed at different points in the sensing optical system 10 shown in FIG. 6. FIG. 7 shows change amounts of the optical performance when the optical element arranged at a predetermined position (i.e., one of the points "a" to "g") is subject to a deformation or curvature, subject to a deformation or curvature and then parallel decenter, or subject to a deformation or curvature and then inclined decenter. Numerical values in the table in FIG. 7 use a value at the point "d" as a reference (1.00), and indicate a relative ratio to the reference, although the point "b" is also used as a reference when the point "d" has a value of 0.

First, a result of changing optical performance is reviewed when each surface of the optical element is subject to a deformation or curvature (see column A in the table in FIG. 7). In order to estimate a change amount of the optical performance when the optical element deforms, different curvatures are applied to respective surfaces $R1_A$ and $R2_A$ on the optical element, and individually generated aberrations are added to each other, as shown in FIG. 7. The result indicated herein uses a basic wavelength of 600 nm.

Understandably, a distance $Sk_A$ between an image-surface side of the imaging lens back group 16 as the lens's last surface and the image surface greatly changes when the optical element is located at the points "a" and "b". In particular, the point "b" indicates 255.4 times a value at the point "d". This means that an imaging position greatly moves in the focus direction after before the purged space is vacuumed. Apparently, a position that increases the distance $Sk_A$ large is inappropriate to a location for the transmission window member.

The lateral magnification $\beta_A$ greatly changes at the point "b". A change of the lateral magnification $\beta_A$ would result in an image production with an unexpected magnification, and cause a positional offset in an alignment measurement.

Next follows a study of influence on the optical performance when each surface of the optical element is subject to a deformation or curvature and inclined (see column B in the table in FIG. 7). In order to estimate a change amount of the optical performance when the optical element deforms and decenters at its surfaces $R1_B$ and $R2_B$, different curvatures and inclined decenters are applied to respective surfaces $R1_A$ and $R2_A$ on the optical element, and generated aberrations are added to each other, as shown in FIG. 7.

The most remarkable change in optical performance was a difference $dy_{B\ COLOR\ SHIFT}$ ("$dY_B$ CS") in positional offset amount for each wavelength on a plane perpendicular to the optical axis and, in particular, the positional offset amount greatly changes a difference $dy_B$ CS at the point "a" among these points for the optical element. This means that when the alignment detection light has a wide-range wavelength, the wavelength causes a positional offset on the plane on which an imaging position is perpendicular to the optical axis.

Next follows a study of a positional offset amount $dY_{B\ COLOR\ SHIFT\ PER\ SURFACE}$ ("$dY_B$ CSS") to a wavelength for each surface on the optical element. In order to compare the sensitivity for each surface on the optical element, an absolute value of a positional offset amount on each surface is individually calculated after the optical element is located at each position, and an average is used for comparison. Large values are seen at the point "a" as the pupil position or stop 14 for the objective lens 11 and the relay lens 12, at the point "f" near the imaging lens back group 16, and at the point "g" between the imaging lens back group 16 and the image surface. The optical element does not always deform so that both sides have the same curvature, a large shift amount is seen when a single surface has high sensitivity.

Regarding a change amount of influence on the sensing optical system 10 when a single surface of the optical element deforms, it has been found that points "d" and "e" are less influential than the point "f". This is assumed that the point "d" is closer to the pupil 17 and has a smaller light effective diameter. The effective diameters at points "d", "e" and "f" in the instant embodiment are as follows:

Point "d":Point "e":Point "f"=1:2.4:3.6

Therefore, it is concluded that the transmission window member is located at a position that has a small light effective diameter.

Next follows a study of influence on a change of the optical performance at a center wavelength when the optical element itself is inclined while receiving a deformation or curvature as an inclined decenter (at center wavelength) (see column C in the table in FIG. 7). The points "b" and "c" showed large changes in positional offset amount $dy_C$ on a plane perpendicular to the optical axis. The point "g" also showed a relatively large change.

The points "b" and "c" showed large changes in off-axis spherical aberration $wah_C$. The points "d", "e", "f" and "g" did not show any change (i.e., almost zero) in off-axis coma $wac_C$, and the points "a", "b" and "c" showed changes. When these aberrations become large, the measurement reliability and stability deteriorate, since the original mark image is not transmits to the image pickup device, like a blurred image, and an image different from the original image is analyzed.

The points "d", "e" and "f" show large values of color shift $dy_{C\ CD}$, and other points show small values. Although the result indicates that the points "d", "e" and "f" show large values of color shift $dy_{C\ CD}$, the absolute values are insignificant and indifferent. Nevertheless, the color-shift correction, which will be described later, can sufficiently correct any practical problem.

Next follows a study of how similar light effective diameters affect the optical performance when the transmission window member changes its location. For example, the points "c" and "d" are compared with reference to the table in FIG. 7. The point "c" is located near the intermediate image surface 13, while the point "d" is located near the pupil 17 position in the imaging optical system. A light effective diameter ratio between them is: Point "c":Point "d"=1:1.5. Therefore, the point "d" has a larger light effective diameter. However, it has been found from comparisons of numerical values in the table shown in FIG. 7 that the point "c" is more influential on the sensing optical system 10. In other words, it is understood that influence on the optical performance changes according to locations of the transmission window member even when the light effective diameter is similar.

It is thus understood that when the transmission window member is provided at one of the points "a", "b" and "c", the performance of the sensing optical system 10 sensitively changes, that the transmission window member should be located at a position that has a small light effective diameter, and that the transmission window member is preferably close to the pupil.

The point "g" near the image surface exhibits small change amounts other than a color shift amount $dy_C$, and thus is useful as a location for the transmission window member when the color shift is corrected. If there are plural image surfaces (including an intermediate image surface), it is apparent that a window member is arranged on an image surface that has a possibly higher magnification or, preferably, the highest magnification.

Accordingly, it can be concluded that the transmission window member is located preferably between the stop (or pupil) 17 shown in FIG. 6 and the imaging lens back group 16, and more preferably at the point "d" from a comprehensive viewpoint.

Although the point "g" is useful for a location of the transmission window member, it generates a color shift, and a configuration to correct the color shift is vital.

An arrangement of the transmission window member to a position that does not affect the optical performance of the sensing optical system 10 has been described above, but as shown in the table in FIG. 7, the non-influential level is not zero. Accordingly, a description will be given of a correction of influence on the sensing optical system when a force deforms the optical element, which provides an optical element having parallel planes as a substitute for the transmission window member.

Referring now to FIG. 6, a description will be given of a correction of the distance $Sk_A$ between an image-surface side of the imaging lens back group 16 as the lens's last surface and the image surface. Since the distance $Sk_A$ changes as the imaging position shifts in a focus direction of the optical axis, a movement of an image surface of the image pickup device in the focus direction of the optical axis at the imaging position would be able to adjust a change of the distance $Sk_A$.

In order to handle changes with time, the adjustment is preferably automatic. For example, a pressure sensor always measures a pressure difference between the purged and external spaces. When the measured pressure difference value exceeds a certain amount, a change amount of the transmission window member varies and an offset value can change. Accordingly, the instant embodiment provides the image pickup device with a drive system, detects the alignment mark while driving the image pickup device, and determines the best position for the image pickup device based on a detection signal. An alternative method detects an alignment mark while driving the object to be detected (such as a wafer) in a focus direction, and determines the best position.

In correcting the lateral magnification $\beta_A$, a signal processing system recognizes and reflects in processing a change of the lateral magnification $\beta_A$ as an offset amount as a result of that the transmission window member is located.

In order to handle changes with time, this adjustment is preferably automatic. For example, an alignment mark with a known mark interval is measured. When the measured mark interval is signal-processed, the mark interval on an image can be recognized that takes the current magnification offset amount into account, since the mark interval is known. As a deformation or curvature amount of the transmission window member changes with time, the mark changes on the image and a true lateral magnification $\beta_A$ can be recognized. The magnification is corrected by using this true lateral magnification $\beta_A$.

A correcting optical element located on the optical path can adjust a positional offset dy of the image on the image surface. FIG. 8 shows a schematic view of a changing image position on a plane that perpendicularly intersects the optical axis when the correcting optical element inclines on the optical path.

Figures 8A, 8B, 8C:
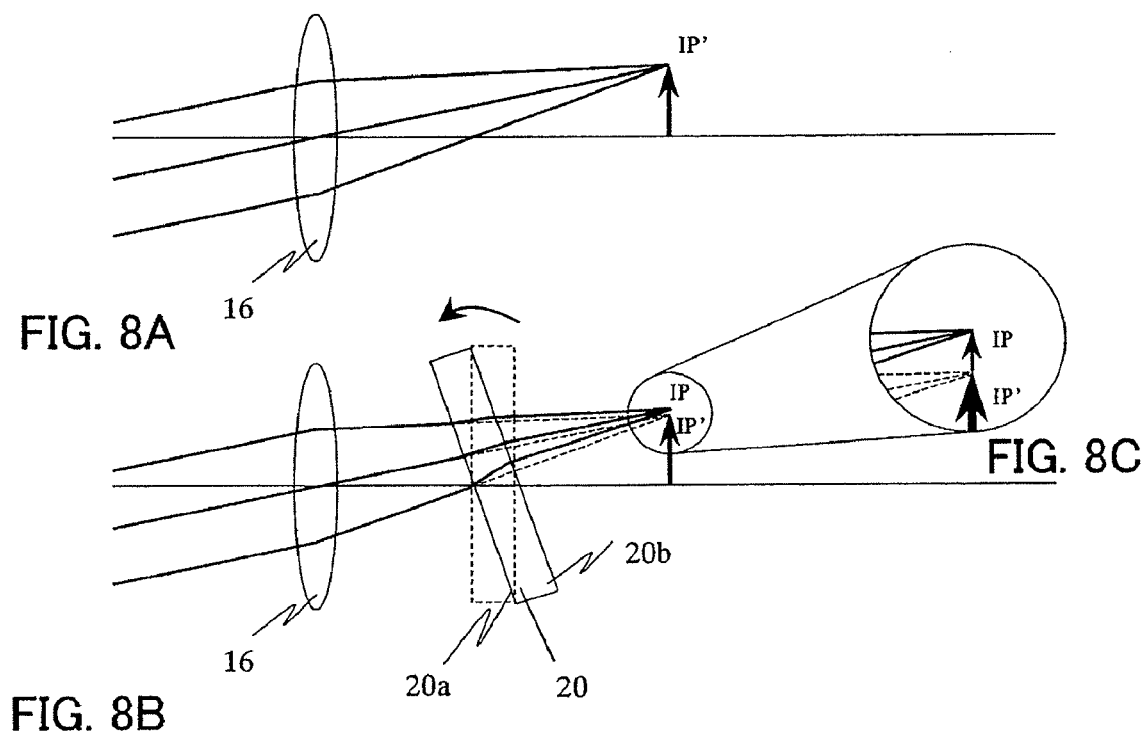
FIGS. 8(a), 8(b), and 8(c) are a schematic view showing changes at image positions on a plane that perpendicularly intersects the optical axis when a correcting optical element inclines on the optical path.

FIG. 8A schematically shows an imaging state of the light that has an angle of view, where an imaging position IP' is different from the expected position due to a deformation of the transmission window member (not shown). As shown in FIG. 8B, the correcting optical element 20 is provided and inclined according to the positional offset amount. The light incident upon the optical element 20 is refracted and emitted by the optical element 20 at both surfaces 20a and 20b in accordance with Snell's law. Here, the incident light upon the optical element 20 is parallel to the exit light from the optical element 20. The imaging position after the light transmits through the optical element 20 changes a position on a plane perpendicular to the optical axis and a focus according to an inclination degree of the optical element 20 (see FIG. 8C). However, an enlargement system, such as a sensing optical system, has a small NA near the image pickup device and a focus change is negligible. Accordingly, an inclination of the correcting optical element 20 would be able to adjust a change of a positional offset dy of an image changes on the image surface.

Alternatively, an adjustment can use parallel decenter of the image pickup device. While it has been described that an adjustment of the distance $Sk_A$ needs to move the image pickup device in the focus direction, a movement on the plane perpendicular to the optical axis is sufficient to correct changes of the positional offset dy on an image on the image surface.

Since a change of the positional offset dy of an image on the image surface is directly connected, for example, to a change of a baseline amount in the OA optical system, when the positional offset is corrected, the baseline amount needs to be measured again.

Figure 9:
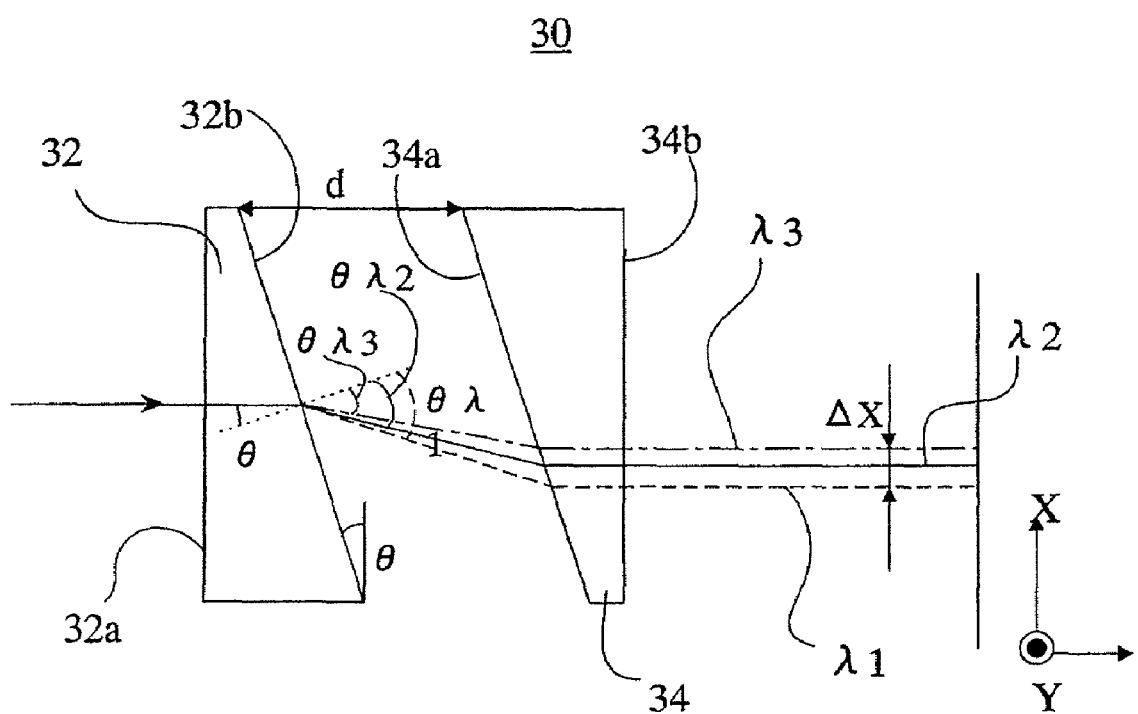
FIG. 9 is a schematic view of a color wedge for correcting color shifts.

Referring to FIG. 9, a description will be given of a correction of a color shift that occurs when the transmission window member deforms. FIG. 9 is a schematic view of a color wedge 30 for correcting the color shift. The color wedge 30 arranges two wedge-shaped transmission elements 32 and 34 opposite to each other, where "d" is an interval between them.

Wide-range light (with wavelengths: $\lambda 1 < \lambda 2 < \lambda 3$) incident upon a side surface 32a of the transmission element 32 from the left direction in FIG. 9 exits from a side surface 32b having a gradient, at different exit angles ($\theta_{\lambda 1} > \theta_{\lambda 2} > \lambda_{\lambda 3}$) for each wavelength since the light has different refractive indexes to wavelengths. The light that has exited from the side surface 32b of the transmission element 32 travels by a distance "d" between the transmission elements 32 and 34, and enters a side surface 34a of the transmission element 34. Respective wavelengths have different refractive indexes even on the side surface 34a of the transmission element 34 since a difference of refractive index. However, since these two transmission elements 32 and 34 have side surfaces 32b and 34a having the same gradient ($\theta$), the beams emitted from the side surface 34b of the transmission element 34 are parallel to the light incident upon the side surface 32a of the transmission element 32.

A color shift $\Delta X$ at the image point of light that has transmits through the color wedge 30 is proportional to the interval "d" between the transmission elements 32 and 34. This configuration thus uses the color wedge 30 to correct a color shift caused by a deformation of the transmission window member.

In order to handle changes with time, an automatic color-shift correction is preferable. For example, a reference mark in each sensing system is measured with different wavelengths of the illumination light. A difference in measurement value for illumination light's wavelengths is obtained from the measured values, and the difference "d" between these two transmission elements 32 and 34 in the color wedge 30 is determined. The difference "d" between these two transmission elements 32 and 34 in the color wedge 30 is made freely adjustable by an automatic drive, and adjusted to the determined interval "d" that is the best interval for the color-shift correction amount.

A description will be given of a measurement and correction of an off-axis spherical aberration $wah_C$ and off-axis coma wac.

A measurement method estimates an aberrational amount, for example, by drawing a contrast curve for the off-axis spherical aberration $wah_c$. When the alignment mark is measured by changing focuses, a convex waveform can be drawn with a peak value of a contrast amount for a certain defocus position. Understandably, when this convex waveform has a small full width at half maximum and a low peak value, an amount of spherical aberration is small, whereas a large full width at half maximum means a large amount of spherical aberration.

When the OA optical system detects a step mark, for example, the off-axis coma $wac_c$ occurs as an asymmetry of a detection signal. When a correlation between this asymmetry and coma amount has been obtained in advance, the current optical system's coma can be estimated.

The off-axis spherical aberration $wah_c$ and the off-axis coma $wac_c$ can be corrected, when their values are ascertained. For example, an optical element that has a deformation amount (such as a curvature and a decenter) of the transmission window member with a reverse sign (such as an optical element that has a shape of the deformed transmission window member rotated by 180° around its center axis), is located at a position that has almost the same sensitivity as that at a position at which the transmission window member is located.

Figure 10:
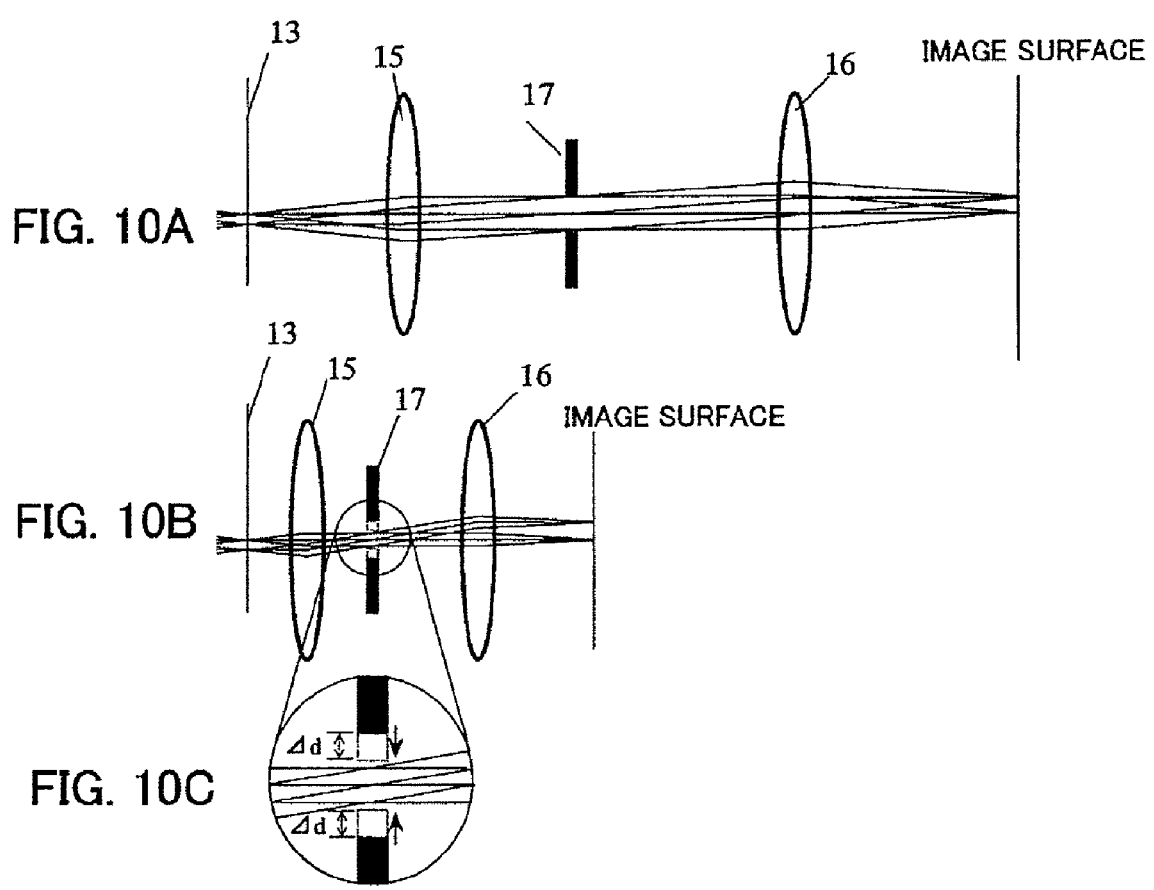
FIGS. 10(a), 10(b), and 10(c) are a schematic view showing part of the basic sensing optical system shown in FIG. 6.

In view of the result that a single surface of the transmission window member has small sensitivity to the optical performance when the transmission window member is located at a position that has a small light effective diameter, the instant inventors have studied a case that shortens the focal distance while maintaining the magnification, thereby shortening the span of the sensing optical system and reducing the light effective diameter at the pupil. FIG. 10 is a schematic view showing part of the basic sensing optical system 10 shown in FIG. 6 (such as the imaging lens front group 15 and back group 16 and the stop 17).

Referring to FIG. 10A, the light, which has been once imaged on the intermediate image surface 13 through an objective lens and relay lens (not shown but similar to the objective lens 11 and the relay lens 12 in FIG. 10), images on the image surface by the imaging lens front group 15 and back group 16 as an imaging lens system. Here, 17 is a stop placed on the pupil surface of the imaging lens system that includes the imaging lens front group 15 and back group 16.

The imaging lens system that includes the imaging lens front group 15 and back group 16 can reduce the light effective diameter at the stop 17. More specifically, the shortened focal distance of the imaging lens front group 15 can reduce the light effective diameter at the stop 17.

A ratio between an imaging lens front group 15's focal distance $f_{15}$ and an imaging lens back group 16's focal distance $f_{16}$ determines the imaging lens system's magnification. If the imaging lens front group 15's focal distance $f_{15}$ is shortened, the imaging lens back group 16's focal distance $f_{16}$ should be shortened to maintain the imaging lens system's magnification constant.

FIG. 10B shows a sensing optical system that takes the foregoing into account, and reduces the diameter of the pupil or stop 17 by Δd. FIG. 10B shortens the imaging lens front group 15's focal distance $f_{15}$ and the imaging lens back group 16's focal distance $f_{16}$, and maintains the imaging lens system's magnification constant. As shown in FIG. 10C as an enlarged view around the stop or pupil 17, the light effective diameter at the position of the pupil or stop 17 shown in FIG. 10B (see a middle broken line in FIG. 10C) is smaller than that of the stop 17 shown in FIG. 10A (see a middle solid line in FIG. 10C).

Since this arrangement can produce a position that can reduce the light effective diameter near the pupil, and lower a deterioration of the sensing optical system's performance when the transmission window member is located at this position.

While the shortened imaging lens front group 15's focal distance $f_{15}$ and the shortened imaging lens system can reduce the light effective diameter near the pupil or stop 17, as discussed, the shortened imaging lens system may not possibly configure lenses so as to maintain the span necessary for the detection optical system.

Accordingly, the sensing optical system can include three optical systems so that the second group's pupil has a reduced light effective diameter and arranges a transmission window member. Since the second optical system increases the magnification and shortens a span, the third optical system corrects the span to be a necessary length. Since the sensing optical system has three optical systems, the light effective diameter can be reduced further by making the second optical system's magnification larger than the necessary magnification. The third optical system can correct the unnecessarily increased magnification of the second optical system to the necessary magnification.

Figure 11:
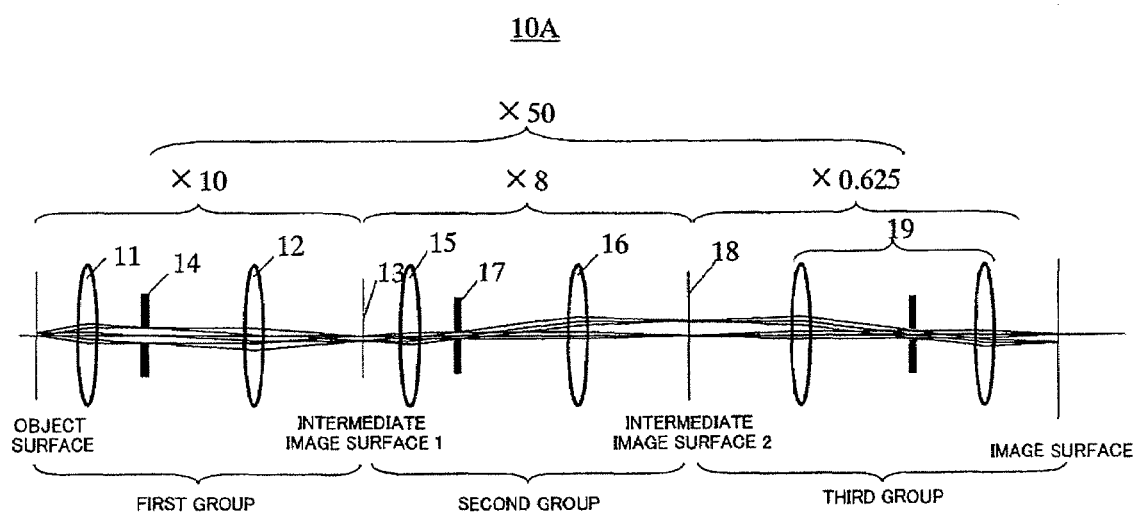
FIG. 11 is a schematic view of a variation of the basic sensing optical system shown in FIG. 6.

FIG. 11 shows a schematic view of a sensing optical system 10A as a variation of the sensing optical system 10 shown in FIG. 6. The sensing optical system 10A contemplates an optical system that includes three groups and has 50 times as a whole. It has been found that the light effective diameter near a pupil or stop 17 of the second imaging lens system is preferably as small as possible at a position for the transmission window member to locate.

Since the imaging lens front group 15 determines the light effective diameter of the pupil or stop 17 of the second group, the sensing optical system 10A adjusts the imaging lens front group 15 and attempts to reduce the light effective diameter of the pupil or stop 17 of the second group prior to other conditions, such as a magnification and a span, while these other conditions have fewer restrictions.

One solution to reduce the light effective diameter of the pupil or stop 17 of the second group is, for example, to an increased magnification of the imaging lens system, such as the imaging lens front group 15 and the imaging lens back group 16, or a reduced focal distance of the imaging lens front group 15. Thereby, the transmission window member is located near the pupil or stop 17 of the second group that has reduced the light effective diameter.

The third group re-images light on an image surface through the third group's imaging lens group 19, which has formed an image on the intermediate image surface 18 through the second group's imaging lens system, such as the imaging lens front group 15 and the imaging lens back group 16. The third group corrects the performance of the sensing optical system 10A as required. If the first group's objective lens 11 and relay lens 12 have 10 times, and the second group's imaging lens front group 15 and back group 16 have a relatively high magnification, for example, 8 times for a reduced light effective diameter at a position for the transmission window member to locate, the sensing optical system 10A has the magnification of 80 times up to the second group.

When the third group sets its magnification to be 0.625 times, the sensing optical system 10A has an originally required magnification of 50 times. Since the second group is shortened for a reduced light effective diameter near the pupil or stop 17 in the second group, the third group is adjusted to have a necessary span and maintain locations for mirrors etc.

Since a color shift can occur when the second group has a larger magnification for a reduced pupil's diameter, the third group needs to correct the color shift.

A concrete description will now be given of an application example to a sensing optical system in an exposure apparatus. FIG. 1 is a schematic view of an exposure apparatus 100 of one aspect according to the present invention. The exposure apparatus 100 is a reduction exposure apparatus that exposes a circuit pattern formed on a reticle 112 onto a wafer 115.

The exposure apparatus 100 accommodates a light source 110, an illumination optical system 111, a reticle 112, a reticle stage 113, a projection optical system 114, a wafer 115, a wafer stage 116, various sensing optical systems, and an optical path of the exposure light and its vicinity in a purged space PE that is a closed space and purged with purge gas or vacuumed, and includes an external space OE other than the purged space PE, a diaphragm 120 that partitions these spaces, a transmission window member 130 provided at the diaphragm 120 for an optical system that is arranged across these purged space PE and external space OE, etc.

The exposure apparatus is referred to as a stepper, when illuminating light from the top of the reticle 112 and sequentially exposing the reticle pattern onto the wafer 115 through the projection optical system 114 at a fixed position. On the other hand, the exposure apparatus is referred to as a scanner or scanning exposure apparatus, when relatively moving the reticle 112 and the wafer 115 at a speed ratio corresponding to a reduction magnification of the projection optical system 114.

When the exposure light uses the EUV light and the projection optical system 114 etc. include a lens, the light intensity remarkably reduces due to the optical absorption by the lens. Therefore, the illumination optical system 111 and the projection optical system 114 include reflection mirrors and the reticle 112 is formed as a reflection reticle.

On the other hand, the wafer 115 includes a type called a second wafer that has already formed a pattern. In forming a pattern on this wafer, the wafer position should be detected in advance. In addition, an alignment of the reticle 112 and a focus position on a rough surface of the wafer 115 should be required. FIG. 1 shows typical six types of sensing systems.

The OA optical system 140 is a sensing optical system that optically detects an alignment mark on the wafer 115 without using the projection optical system 114. The OA optical system 140 is less subject to optical restrictions for wafer alignment without using the projection optical system 114, and generally provides more precise detections than the detections that use the projection optical system 114.

Figure 2:
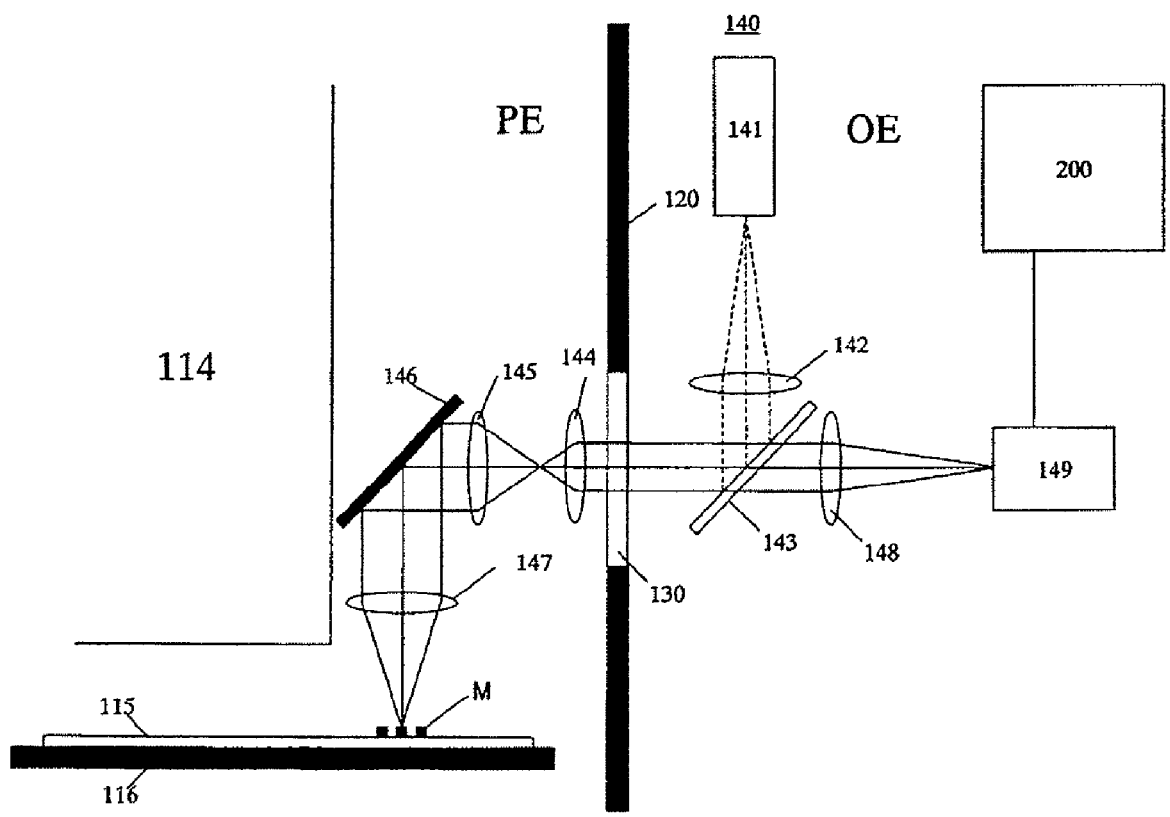
FIG. 2 is a schematic enlarged view of an off-axis alignment optical system shown in FIG. 1.

Referring now to FIG. 2, a description will be given of the OA optical system 140 as a position sensor as one aspect according to the present invention. FIG. 2 is a schematic enlarged view of the OA optical system 140 shown in FIG. 1. The OA optical system 140 has an illumination light source 141 that uses a halogen lamp, etc. to supply light with a wide-range wavelength or uses He—Ne laser to supply monochromatic light.

A wafer-stage position-sensing interferometer 170, which will be described later, measures a lateral distance of the wafer stage 116. Based on the measurement result, the wafer stage 116 drives and positions the alignment mark M on the wafer 115 within a range detectable by the OA optical system 140. The illumination light emitted from the illumination light source 141 is reflected by the half mirror 143 via the illumination optical system's lens 142, and then transmits through the transmission window member 130 provided at the diaphragm that partitions the purged space PE and the external space OE.

The illumination light that transmits through the transmission window member 130 is reflected by the mirror 146 via the imaging lens 144 and the relay lens 145, and enters the objective lens 147. The illumination light condensed by the objective lens 147 illuminates the alignment mark M on the wafer 115 that has been driven by the detection result by the wafer-stage position-sensing interferometer 170 and positioned by the observable range.

The reflected scatter light from the alignment mark M is reflected by the mirror 146 via the objective lens 147, and enters the relay lens 145. Then, the light transmits through the half mirror 143 via the imaging lens 144 and the transmission window member 130, is condensed by the imaging lens 148, and forms an image of the alignment mark M on the image pickup device 149, such as a CCD.

An image signal of the image of the alignment mark M formed on the image pickup device 149 is sent to and processed by a processor 200. The processor 200 detects a position of the alignment mark M on the wafer 115 and arrangement information formed in the wafer based on the information from the wafer-stage position-sensing interferometer 170.

The transmission window member 130 is located at a position that has the smallest light effective diameter on the optical path in the OA optical system 140. Therefore, the OA optical system 140 reduces a deterioration of its optical performance when a pressure difference between the purged space PE and the external space OE deforms the transmission window member 130.

The OA optical system 140 locates the transmission window member 130 at a position that has the smallest light effective diameter between the imaging lenses 144 and 148, and reduces the aberration and optical performance's sensitivity in comparison with the transmission window member 130 located at another position. This cannot completely eliminate aberration and a positional offset of an image, and they still remain.

Figure 3:
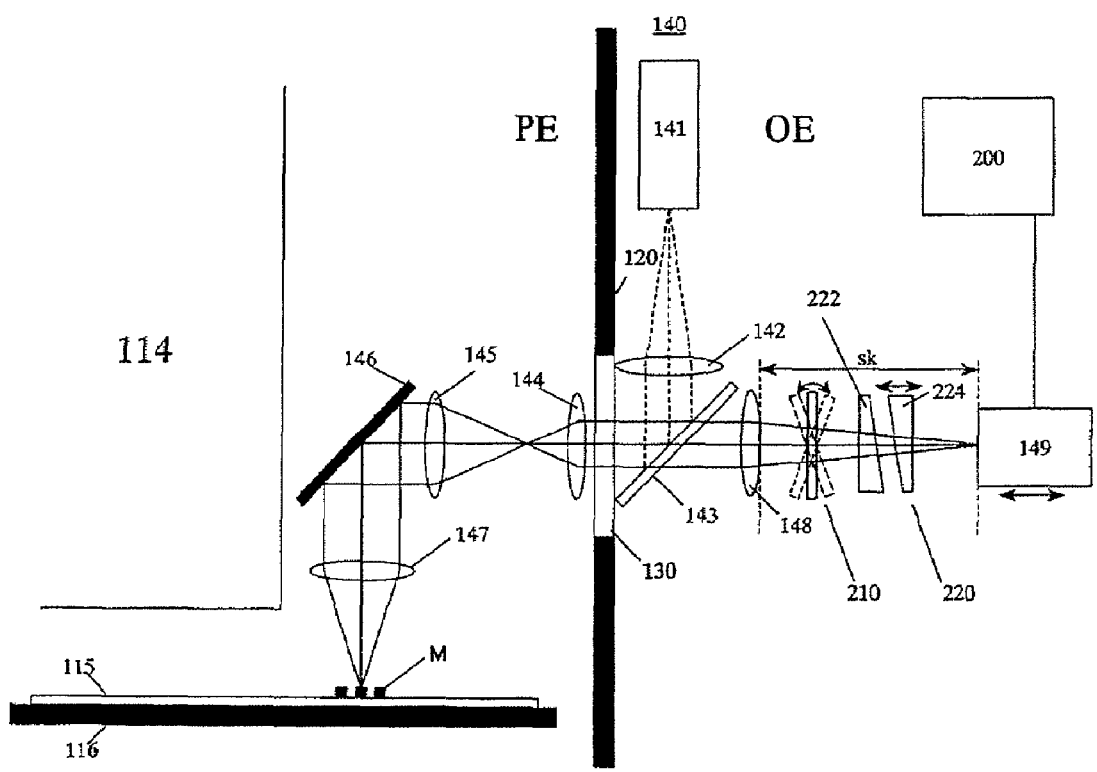
FIG. 3 is a schematic view of an off-axis alignment optical system that has correction means.

Accordingly, the image pickup device 149 itself is made movable in a focus direction of the optical axis, as shown in FIG. 3, so as to correct a variable distance Sk between an image-surface side of the imaging lens 148 as the lens's last surface and the image surface on the image pickup device 149 when the transmission window member 130 deforms. Here, FIG. 3 is a schematic view of the OA optical system 140 that has correction means.

The lateral magnification $\beta$ is not subject to an optical correction and a structural correction, but rather adjusted by the magnification correction by the processor 200 after the image pickup device 149 forms an image. In FIG. 3, the scatter-reflected light from the alignment mark M images on the image pickup device 149 via the OA optical system 140. The image signal is sent to and processed by the processor 200. Since this image processing can adjust the image's magnification $\beta$ to a predetermined value, the lateral magnification $\beta$ is corrected by an offset amount corresponding to its change caused by a deformation of the transmission window member 130.

A positional offset dy of an image on the image surface is corrected by providing a correcting optical element 210 at an appropriate position between a sensing light's transmission and imaging on the image pickup device 149, such as a CCD, and by inclining the optical element 210. Since an inclination of the optical element 210 is proportional to a shift amount of the image, the positional offset dy is adjusted by inclining the optical element 210 while observing an image formed on the image pickup device 149.

A color shift on the image surface (which means that an imaging position shifts according to wavelengths) is corrected by providing a color wedge 220 at an appropriate position between a sensing light's transmission and imaging on the image pickup device 149, such as a CCD, and by inclining the optical element 210. The color wedge 220 includes two opposite transmission elements 222 and 224 each having a wedge section, and used to correct the color shift since the shift amount for each wavelength changes in proportion to a changing interval between the transmission elements 222 and 224.

These structures can correct aberration and a positional offset of an image, which cannot be eliminated only by arranging the transmission window member 130 at a position that has the smallest pupil's effective diameter, and enable highly precise measurements by the OA optical system.

The compressed transmission window member 130 can generate birefringence, which is difficult to be corrected by correction means as described with reference to FIG. 3. However, it is anticipated that the birefringence affects polarization and is less influential on the optical performance of the OA optical system 140 if the transmission window member 130 is located subsequent to the polarizer that defines polarization. Accordingly, when the transmission window member 130 is located subsequent to or at the image side of the polarizer, for example, by using a polarization beam splitter, a deformation of the transmission window member 130 becomes less influential on the optical performance.

Figure 4:
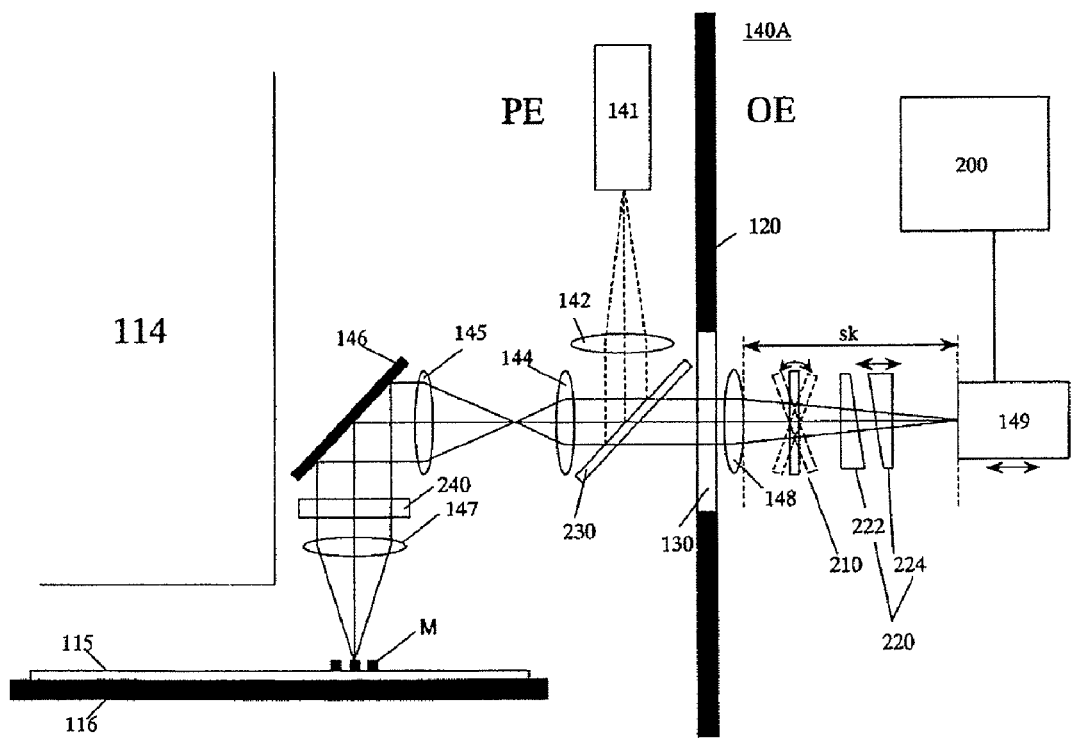
FIG. 4 is a schematic view of a variation of an off-axis alignment optical system shown in FIG. 3.

FIG. 4 is a schematic view of an OA optical system 140A as a variation of the OA optical system 140 shown in FIG. 3. The OA optical system 140A is similar to the OA optical system 140 shown in FIG. 3, but attempts to reduce influence of the birefringence caused by a deformation of the transmission window member 130.

Referring to FIG. 4, the light emitted from the light source 141 illuminates a polarization beam splitter 230 through an illumination optical system's lens 142. The polarization beam splitter 230 has different transmittance and reflectance according to polarized directions of the incident light. The polarization beam splitter 230 used for the instant embodiment reflects s-polarized light and transmits p-polarized light among the illumination light.

The illumination light reflected by the polarization beam splitter 230 transmits through the relay lens 145 through the imaging lens 144 and then is reflected by the mirror 146. The illumination light reflected by the mirror 146 transmits a λ/4 plate 240, and irradiates an alignment mark M through the objective lens 147. The λ/4 plate 240 converts the s-polarized light into circularly polarized light, which is, in turn, irradiated onto the alignment mark M on the wafer 115.

The scatter-reflected light from the alignment mark M enters the polarization beam splitter 230 via the objective lens 147, the λ/4 plate 240, the mirror 146, the relay lens 145, and the imaging lens 144. The beam splitter 230 transmits the p-polarized light and reflects the s-polarized light, as described above. When the scatter-reflected light from the alignment mark M transmits through the λ/4 plate 240, the circularly polarized light is converted into the p-polarized light. Therefore, the scatter-reflected light from the alignment mark M transmits through the polarization beam splitter 230, and images on the image pickup device 149 through the transmission window member 130, the imaging lens 148, the optical element 210, and the color wedge 220.

The OA optical system 140A arranges the transmission window member 130 subsequent to the polarizer, reduces the influence of the birefringence caused by a deformation of the transmission window member 130, and provides highly precise measurements.

The OA optical system 140 arranges an illumination light source 141 in the purged space PE, but the illumination light source 141 would cause a problem of thermal radiation. Therefore, the illumination light source 141 may be installed in the purged space PE if the problems of thermal radiation, etc. are solved, but otherwise it is preferable to arrange the illumination light source 141 in the external space OE and to use an irradiation through the transmission window member 130.

The wafer-surface position-sensing optical system 150 measures, in an oblique incidence manner, a focus position of a rough surface (in an optical-axis direction of the projection optical system 140) of the wafer 115 as a substrate. The exposure apparatus 100 increases the numerical aperture of the projection optical system 114 to enhance the resolution, and thus the depth of focus becomes small. Therefore, the autofocus mechanism is needed to focus the surface of the wafer 115 on the image surface of the projection optical system based on a measurement result of a surface state of the wafer 115 by the focus position-sensing optical system that uses the oblique incidence manner, like the wafer-surface position-sensing optical system 150.

Figure 5:
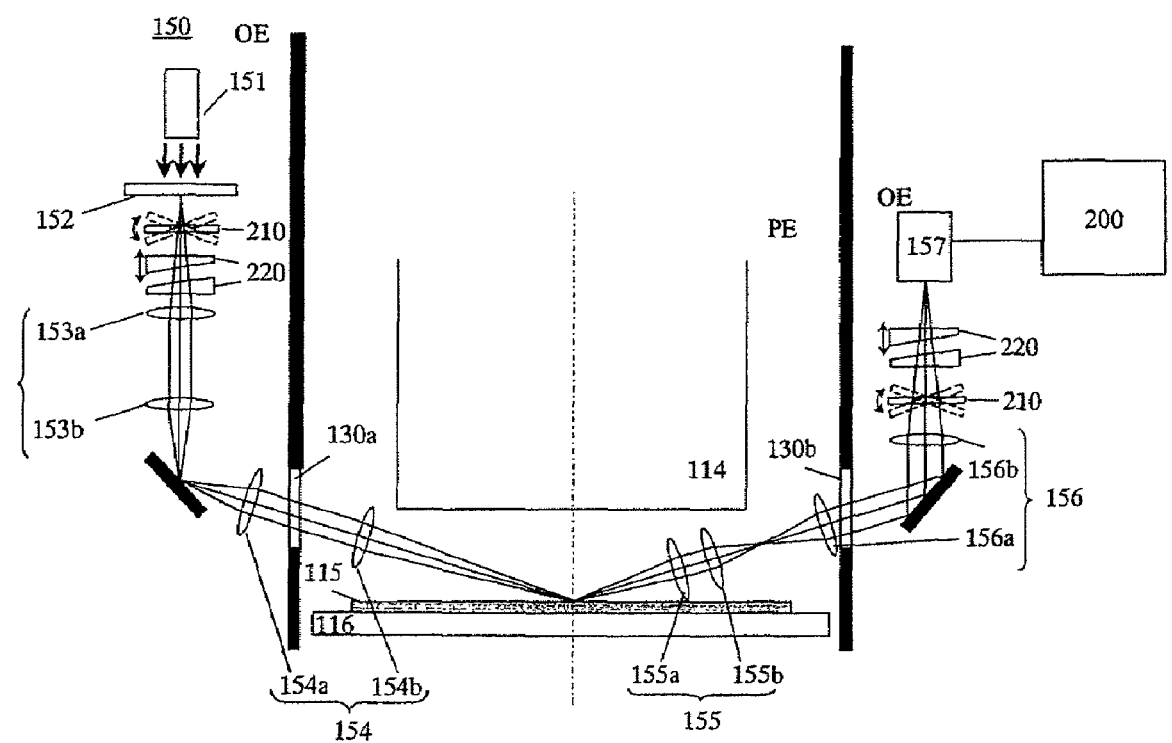
FIG. 5 is a schematic enlarged view of a wafer-surface position-sensing optical system shown in FIG. 1.

FIG. 5 shows a schematic enlarged view of the wafer-surface position-sensing optical system 150 shown in FIG. 1. Referring to FIG. 5, the light emitted from the light source 151 illuminates the slit plate 152. Multipoint measurements are needed to simultaneously measure a tilt amount and focus of the wafer 115. Accordingly, the slit plate 152 has plural slits, such as 3×3=9 points.

The light that has transmitted through the slit plate 152 enters the transmission window member 130a that partitions the purged space PE and the external space OP, through an optical element 210 that corrects a positional offset, a color wedge 220 that corrects a color shift, a projection system front group 153 that includes a relay lens 153a and an imaging lens 153b, and a relay lens 154a. The light that has transmitted through the transmission window member 130a is imaged on the wafer 115 through the imaging lens 154b.

Those elements from the slit plate 152 through the wafer 115 have a similar configuration as the sensing optical system 10 shown in FIG. 6. The transmission window member 130a is located near a pupil point of the projection optical system back group 154 or near one of a surface that Fourier-converts the slit plate 152 and a surface conjugate with the surface that Fourier-converts the slit plate 152, which one has the smallest light effective diameter. Thus, a deformation of transmission window member 130a is less influential to the optical performance.

The optical element 210 and the color wedge 220 at the back of the slit plate 152 correct positional and color shifts of an image at an imaging position on the wafer 115.

The light that has been regularly reflected on the wafer 115 enters the transmission window member 130b that partitions the purged space PE and the external space OP, through the light receiving system front group 155 that includes the relay lens 155a and imaging lens 155b, and the relay lens 156a. The light that has transmitted through the transmission window member 130b is imaged on the image-pickup device 157 through the imaging lens 156b, an optical element 210 for correcting a positional offset, and a color wedge 220 for correcting a color shift.

When the wafer 115 shifts from the projection optical system 114 in a defocus direction, the image pickup device 157 of the wafer-surface position-sensing optical system 150 generates a positional offset from a plane perpendicular to the optical axis of the wafer-surface position-sensing optical system 150. When the wafer 115 tilts, a tilt amount around the Y-axis is calculated from a span amount at a known measured point.

Thereby, the defocus and tilt amounts of the wafer 115 are recognized, and the result is sent to the processor 200. Then, the processor 200 sends optimal values of the defocus and tilt amounts to the wafer stage 116 to correct the focus position and tilt of the wafer 115.

Similar to the projection optical system, those elements on the wafer 115 from the object surface of the light receiving system (or imaging surface viewed from the light projection system) arrange the transmission window member 130b near the pupil position of the light receiving system back group 156, and reduce the influence on the optical performance of the wafer-surface position-sensing optical system 150 caused by a deformation of the transmission window member 130b.

The optical element 210 and the color wedge 220 serve to correct positional and color shifts on the image surface for the image pickup device 157 as described for the projection system. In particular, the correction of a shift amount needs to carefully and regularly confirm the shift amount and execute alignments.

This structure enables the wafer-surface position-sensing optical system 150 to reduce aberrations and positional offsets caused by deformations of the transmission window members 130a and 130b, and to measure a position of the wafer 115 with high precision.

The reticle alignment optical system 160 detects whether relative positions between the reticle 112 and the reticle stage 113 are appropriate. The reticle alignment optical system 160 aligns the reticle 112 by observing in the same field the alignment mark on the reticle 112 and the reticle reference mark on the reticle stage 113, and by measuring their relative positions.

The wafer-stage position-sensing interferometer 170 irradiates a laser beam onto a surface at the side surface of the wafer stage 116 and a reference surface, measures interference with light from the reference surface, and precisely measures a position of the wafer stage 116.

The reticle-surface position-sensing optical system 180 measures a surface shape of the reticle 112 in an oblique incidence manner. The improved resolution of the exposure apparatus 100 cannot neglect a deformation of the reticle, which is caused by a deformation of the reticle 112 by its own weight, a flatness of the reticle pattern surface, a flatness of a contact surface in absorbing and holding the reticle onto a reticle holder, etc. A deformation of the reticle 112 is different according to reticles, and thus it is necessary to measure the deformation after the reticle 112 is mounted. The reticle-surface position-sensing optical system 180 measures a surface shape of the reticle 112, and corrects a position of the reticle pattern surface in a height direction, thereby compensating imaging performance.

The position-sensing optical system 190 uses exposure light etc., reticle 112 and the projection optical system 114 to measure relative positions between the reticle 112 and the wafer 115 in a through the lens auto alignment ("TTL-AA") manner. In the position-sensing optical system 190, the illumination light emitted from the light source 191 is reflected by the half mirror 192 and enters the transmission window member 130 through the lens 193.

The illumination light that has transmitted through the transmission window member 130 is reflected on the mirror 194 and irradiates the alignment mark (not shown) on the reticle 112. The image pickup device 195 images the scattered reflected light from the alignment mark via the mirror 194, the transmission window member 130, the lens 193, and the half mirror 192.

The detection light that has transmitted through the transmission area other than the alignment mark on the reticle 112 illuminates the alignment mark on the wafer 115 via the projection optical system 114. The scattered reflected light from the alignment mark 115 transmits through the projection optical system 114, and imaged by the image pickup device 195 through the transmission area other than the alignment mark on the reticle, the mirror 194, the transmission window member 130, lens 193 and the half mirror 192.

Thus, the alignment mark on the reticle 112 and the alignment mark on the wafer 115 can be simultaneously observed to measure a relative positional relationship (in a direction perpendicular to the optical axis of the projection optical system 114) and a conjugate relationship (for focusing) between the reticle 112 and the wafer 115.

The exposure apparatus 100 arranges the transmission window member 130 at a position having the smallest light effective diameter for the OA optical system 140 and the wafer-surface position-sensing optical system 150. Of course, the present invention is applicable to such an optical system as includes a transmission window member for portioning two spaces that have different pressures, such as the reticle alignment optical system 160, the wafer stage position-sensing interferometer 170, the reticle-surface position-sensing optical system 180, and the position-sensing optical system 190.

A description will be given of the transmission window member 130 provided at the diaphragm 120 that partitions the purged space PE and the external space OE. A reduced deformation amount of the transmission window member 130 caused by a pressure difference between the purged space PE and the external space OE would be less influential to the optical performance.

For example, the instant embodiment assumes that the transmission window member 130 has a thickness of several millimeters, but the transmission window member 130 that has been made thicker would reduce the deformation amount and reduce influence on the optical performance. Alternatively, the transmission window member 130 may be made of a glass material that has physical properties that are less deformable under the pressure.

Thus, an increased thickness and a proper material selection for the transmission window member 130 would reduce a deformation of the transmission window member 130. However, a deformed diaphragm 120 that partitions the purged space PE and the external space OE would result in inclined and parallel decenters. Accordingly, as discussed, an arrangement of the transmission window member 130 at a position that is less influential to the optical performance under the inclined and parallel decenters would reduce aberration and an image displacement.

In exposure, the light emitted from the light source 110 Koehler-illuminates the reticle 112 via the illumination optical system 111. The light from the reticle 112 and reflects the reticle pattern is imaged onto the wafer 115 by the projection optical system 114. The exposure apparatus uses various sensing optical systems that precisely detect a position of their objects for alignments, and provide higher quality devices than the conventional, such as semiconductor devices, LCD elements, image pickup devices (e.g., CCDs), and thin film magnetic heads, with excellent economical efficiency and throughput.

Figure 12:
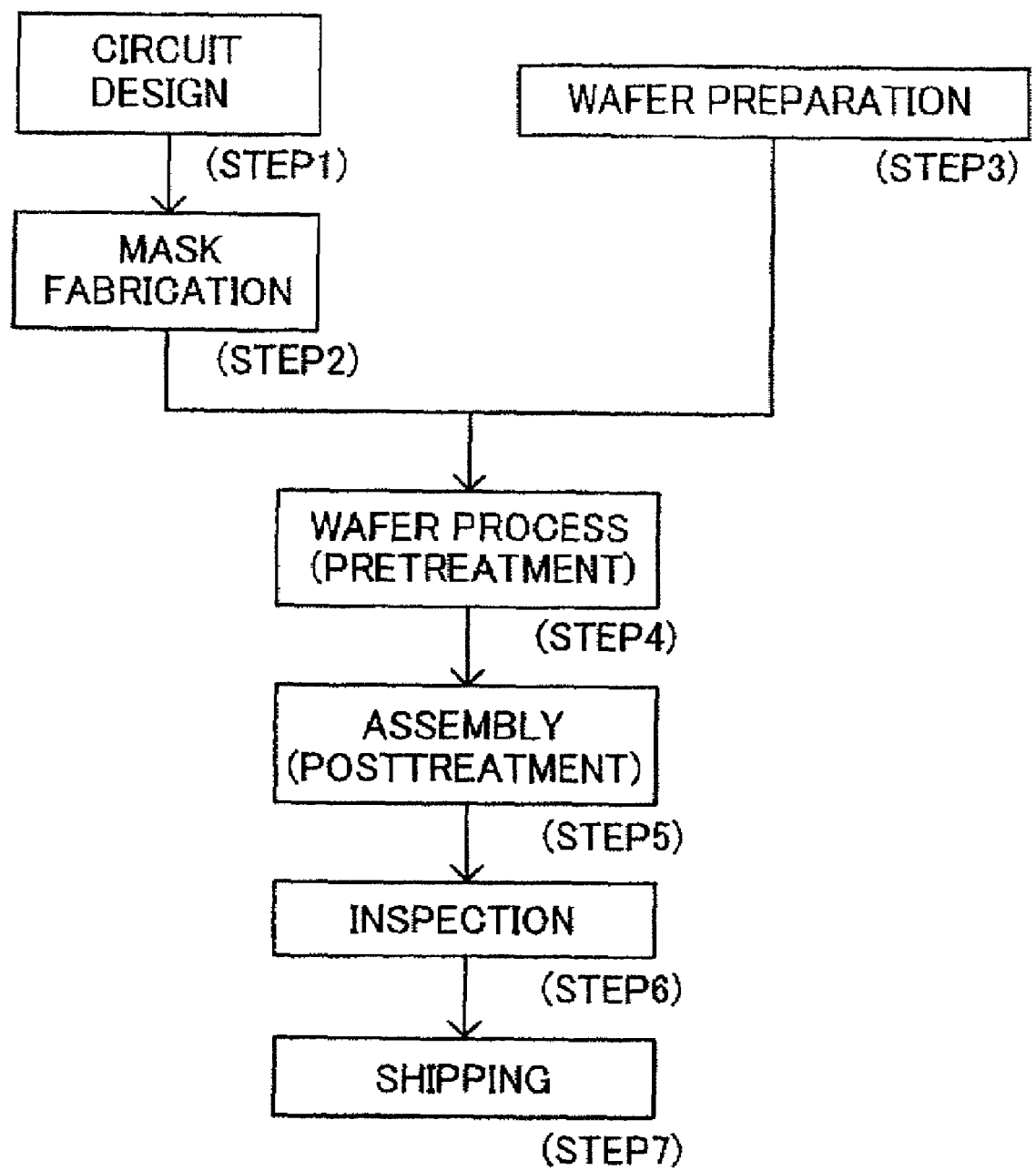
FIG. 12 is a flowchart for explaining how to fabricate devices (such as semiconductor chips such as ICs and LCDs, CCDs, and the like).
Figure 13:
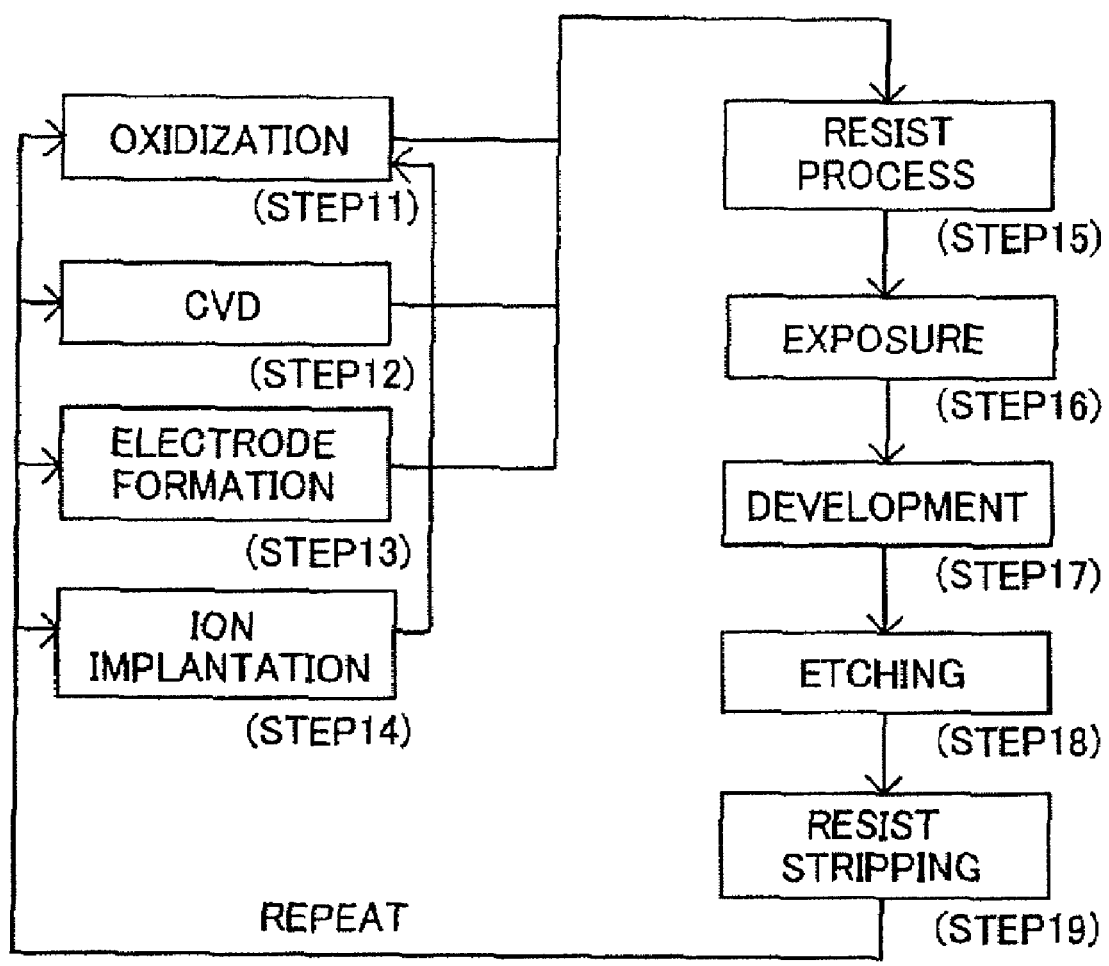
FIG. 13 is a detail flowchart of a wafer process as Step 4 shown in FIG. 12.

Referring now to FIGS. 12 and 13, a description will be given of an embodiment of a device fabricating method using the exposure apparatus 100. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method.

Further, the present invention is not limited to these preferred embodiments, and various variations and modifications may be made without departing from the scope of the present invention.

Thus, the present invention can provide a highly accurate position sensor that maintains the optical performance of its optical system that arranges on an optical path an element as a diaphragm between two spaces having different pressures, even when the element deforms.

What is claimed is:

1. A position detecting apparatus located across a wall configured to partition a first space and a second space that is adjacent to the first space, and has a different pressure from that of the first space, said position detecting apparatus using light to detect a position of an object that is located in the first space, said position detecting apparatus comprising:
    a detector in the second space, and configured to receive the light from the object;
    a polarizer configured to define a polarization direction of the light; and
    an optical element located on the wall, and closer to said detector than said polarizer.

2. A position detecting apparatus according to claim 1, wherein one of the first and second spaces is maintained vacuum.

3. An exposure apparatus comprising:
    a position detecting apparatus located across a wall configured to partition a first space and a second space that is adjacent to the first space, and has a different pressure from that of the first space, said position detecting apparatus using light to detect a position of an object that is located in the first space,
    wherein said position detecting apparatus includes:
    a detector located in the second space, and configured to received the light from the object;
    a polarizer configured to define a polarization direction of the light; and
    an optical element located on the wall, and closer to said detector than said polarizer.

4. An exposure apparatus according to claim 3, wherein the exposure apparatus is configures to expose the object using an electron beam.

5. An exposure apparatus according to claim 3, wherein the exposure apparatus is configured to expose the object using extreme ultraviolet light.

* * * * *